United States Patent [19]

Petersson

[11] 4,202,038
[45] May 6, 1980

[54] METHOD OF EFFECTING ONE OF SEVERAL DIFFERENT CIRCUIT CONNECTIONS

[76] Inventor: Stig Anders Petersson, Ormingeringen 48A,, 13200 Saltsjo-Boö, Sweden

[21] Appl. No.: 971,917

[22] Filed: Dec. 21, 1978

Related U.S. Application Data

[63] Continuation of Ser. No. 823,222, Aug. 10, 1977, abandoned.

[51] Int. Cl.² .......................... G06F 15/02; H01H 7/00
[52] U.S. Cl. .................................. 364/709; 200/5 R; 340/365 R
[58] Field of Search ..................... 364/709; 340/365 R, 340/365 S; 200/5 R, 5 A

[56] References Cited

U.S. PATENT DOCUMENTS

| | | | |
|---|---|---|---|
| 3,852,952 | 12/1974 | Vittoz et al. | 364/709 X |
| 3,967,273 | 6/1976 | Knowlton | 340/365 R X |

Primary Examiner—Jerry Smith
Attorney, Agent, or Firm—Frishauf, Holtz, Goodman & Woodward

[57] ABSTRACT

To permit multiple use of data entry keys, and to effect different circuit connections by a single key, operation of any one of the keys is associated with time slots, or time windows so that, upon operation of anyone of the keys, a course, or sequence of time slots at intervals is initiated, each interval or time slot being temporally associated with a specific circuit connection. The length of the time course, that is, the number of time slots or time intervals is selected by continued operation of anyone of the control buttons, this continuance of operation or operating of another button, entering the then pertaining circuit into the system. An indicator is provided, continuously indicating the then pertaining time slot, and an additional indicator providing a symbolic output representative of the finally established circuit connection. The system may be used with a graphic display, such as a pointer pencil and a screen, the circuit connections establishing representation, sequentially, of electrical components which sequentially appear on the screen at the location indicated by the pointer so that, upon removal of the pointer, the then indicated symbol will persist on the screen, thereby permitting rapid interchange of components and electronically drawing electrical circuit diagrams.

21 Claims, 9 Drawing Figures

METHOD OF EFFECTING ONE OF SEVERAL DIFFERENT CIRCUIT CONNECTIONS

This is a continuation, of application Ser. No. 823,222, filed Aug. 10, 1977 and now abandoned.

This invention relates to the field of selectively controlling the setting up of one of several predetermined mutually different circuit connections.

BACKGROUND AND PRIOR ART

Various devices have keyboards for example for pocket calculators, elevator control, traveling crane control etc. to enter information. It often is a problem that a great number of keys are required for entering of the necessary information. The presence of a great number of keys poses a problem, because it is difficult to select the correct key when there is great number of keys to select from. From a purely physical aspect, this also implies that it takes a longer time to move the fingers of the hand between different keys when a great number of keys is provided, i.e. the distance on the whole of the keyboard relative to the location of individual keys is longer.

For certain types of pocket calculators the above problem of many keys has been somewhat reduced by the introduction of some function keys, for example two keys, each of which has been allotted three functions. The more function keys are introduced, however, the greater is the risk of making errors.

A key can be allotted several functions in different ways. By means of a function key, the function content of a greater number of keys in the board can be changed.

It further is possible to change the function content for the remaining keys as long as a certain key is held depressed, for example the key for capital letters in a typewriter.

By depressing harder a certain key—for example a repetition key—the key function is repeated, as for example in an electric typewriter by depressing the key for text underlining.

In certain control connections it also is known by repeated depressions to bring about a change in a control magnitude, which change is proportional to the number of depressions.

The invention:

Briefly, each individual key is given several functions by arranging different circuit connections, corresponding to said functions, consecutively in time slots, or time reference frames, or time intervals. By a first step, for example the depression of a key, a time course is started from a fixed reference connection, and by further steps with the same or another key, circuit connections corresponding to the length the time course is maintained, that is, the key is actuated which in its turn corresponds to certain functions.

The system has the advantage that the number of keys required can be reduced substantially. Theoretically, a keyboard of any great size can be replaced by one single key, i.e. the function content of the key can be changed an unlimited number of times. In practice, however, the function content of a key is limited by the time of waiting for the desired function and circuit connection, respectively, and by the reaction time, i.e. the time required for safely releasing the key at the moment intended.

The exchange of function and circuit connection, respectively, can be displayed in a simple manner on a screen or by other optical and/or acoustical signal means.

The key functions can be exchanged more rapidly and safely than otherwise possible.

Drawings, illustrating an example:

FIG. 1 is a view of a keyboard of a simple type chosen by way of example,

FIG. 2 is a perspective view of another keyboard for a pocket calculator where the keys have been positioned in close agreement with the geometry of the hand, FIG. 3 shows another example of a calculator with associated circuits in the form of a block diagram, FIG. 4 shows by way of a diagram how a keyboard with four keys according to the invention can operate in principle, FIG. 5 shows the appearance of the pulses in the embodiment according to FIG. 4 at different points, in the circuit. FIG. 6 illustrates a basic flow diagram, FIG. 7 illustrates a modified basic flow diagram.

Figure 1:
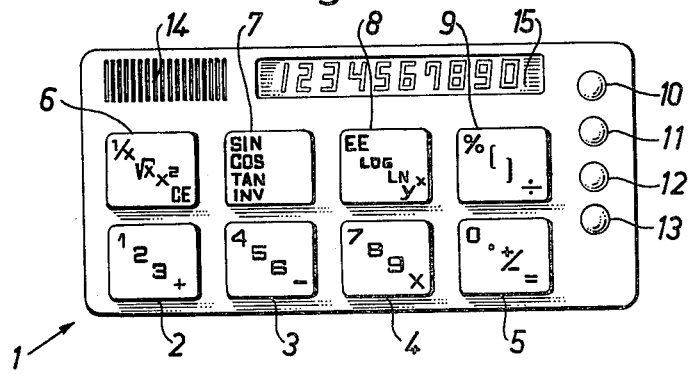

In FIG. 1 a keyboard 1 is shown, which comprises eight keys 2–9, four signal lamps 10–13, one loud-speaker 14, a display unit 15 and various electronic circuits (not shown) within the board 1. The keyboard 1 is intended to feed, for example, numerical digits into a processing unit (not shown). Each key 2,3,4,5,6,7,8,9, is a multifuntction key and has the capability to enter, or control processing information as shown thereon—see FIG. 1. Let it be assumed that, for example, the number 268+ is to be fed into the processing unit (not shown). The key 2 is depressed and a clock circuit (not shown) starts. The lamp 10 of the key status display indicater lamp group 10, 11, 12, 13 is lighted as soon as the key 2 has been depressed, and after, lapse of a time period, or time slot, for example, 0,2 second the lamp 11, located straight beneath the lamp 10, is lighted, and the lamp 10 is extinguished. Change of illumination of the lamps indicated that an exchange of function and circuit connection, respectively, from digit one to digit two has taken place. Simultaneously with the lighting and extinguishing of the lamps 11 and 10, respectively, the loud-speaker 14 sounds. In this way both an acoustic and optic indication of the exchange of function from the digit one to the digit two is obtained. If thereupon the key 2 is released, the digit two is fed into the processing unit (not shown). Unit 1 has an entry display panel 15.

The next digit, six, is then to be fed into the processing unit by key 3. The key 3 is depressed, the lamp 10 is lighted, after about 0,2 second the lamp 11 is lighted and the lamp 10 is extinguished, and at the same time the loud-speaker 14 sounds, preferably with another frequency than at the first function exchange. The function content of the key 3 has hereby been shifted from the digit four to the digit five. When the operator continues to hold the key 3 depressed for another time period, e.g. further about 0,2 seconds, the next function exchange from the digit five to the digit six takes place. The operator thereafter releases the key 3, and the digit six is then fed into the processing unit (not shown).

By means of the third key 4 the digit eight is fed in the same way as above into the processing unit, and by the fourth key 5 the +sign is fed into said processing unit.

The function changeover of the key can be varied, for example in such a manner, that the first function exchange, i.e. the change from digit one to digit two at the first key 2 and, respectively, from four to five at the second key 3 etc. take place, relatively seen, slower than the function exchange from digit two to digit three at the first key 2 etc.

The function exchanges advantageously can also be chosen to take place rhythmically, for example in waltz-time.

The time lapse or time period from the depression of one key until the first function changeover at the key in question takes place, can be chosen, for example, to be between 0,1 second and 0,5 second. A preferred time period can be about 0,2 second, as stated above. The time period from the first function changeover to the second function changeover, however, advantageously can be chosen to be shorter, for example about 0,15 second.

If desired, also a correction function can be built-in, for the event that the key is released at a wrong moment. Such correction can be carried out as follows. When after the release of a key it is observed that a wrong digit has been keyed in, and therefore, the said key again is actuated within a short time after the release, for example 0,1 to 0,4 second, the function previously fed in is not carried out. A delay in the implementation of the function exchange, thus, has been introduced after the release of the key, and the repeated actuation of the key in question results in a new start of the time course for this key from the beginning or alternatively in its proceeding from where it had stopped. Alternatively, a separate "clear entry" (FIG. 3: bottom CE) can be provided.

Figure 2:
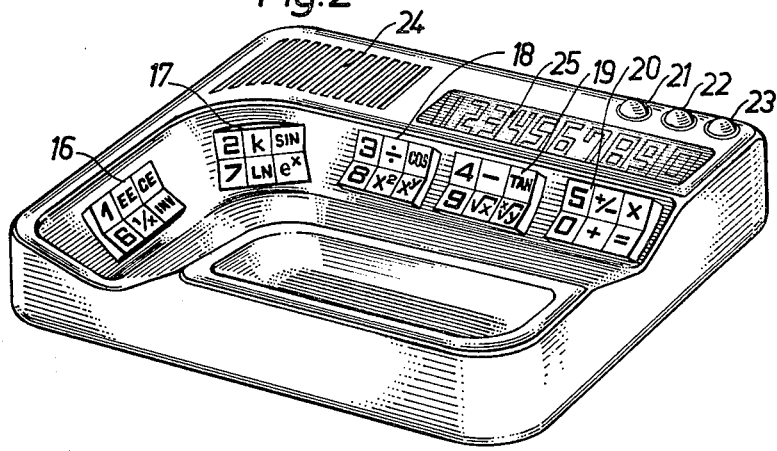

In FIG. 2 a somewhat more complicated variant is shown, where the keys 16–20 are positioned substantially in agreement with the arrangement of the fingers. Each key can consist, for example, of a rocker switch capable to rock from neutral position to two different active positions.

The operator, thus, both can choose, for each key, to tip it in one or the other direction, and by the choice—in the manner described above—of the time to lapse after the actuation of the key in one or the other direction until the release of the key, the operator can decide the function content of the circuit connection to the key. Lamps 21–23 and a loud-speaker 24 indicate each exchange, and a display or screen 25 show the digits keyed in. On the keys 16–20 the digits and functions, respectively, are shown which can be obtained by each key.

Figure 3:
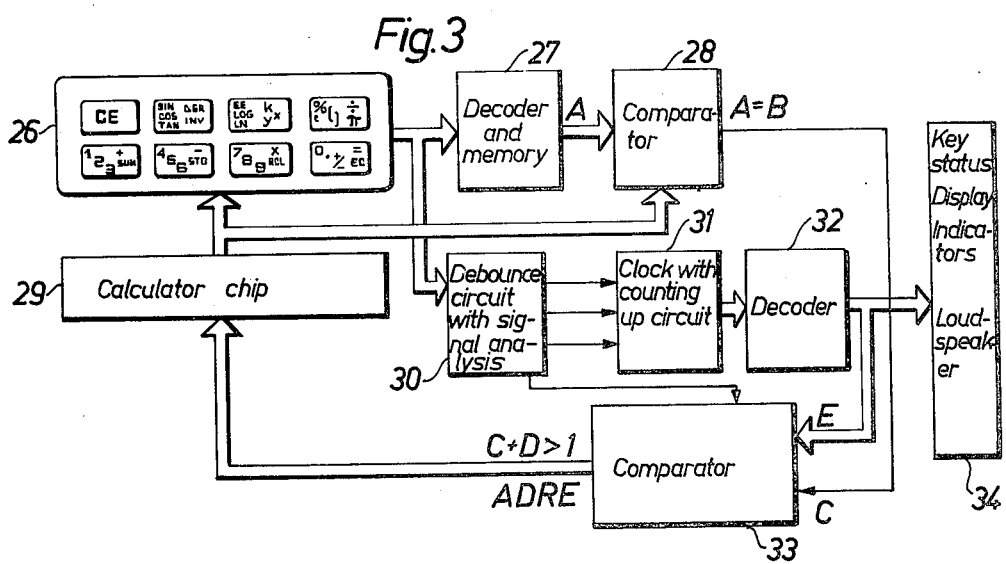

FIG. 3 shows a block diagram for use with a calculator:

Keyboard 26 is generally similar to the keyboard of FIG. 1. The key content appears from the text on the keys, see FIG. 3 and the exchanges of function or signs take place in a manner corresponding to that indicated above, i.e. by the time having elapsed from the moment of depression to the moment of release. To the keys in the keyboard 26 the following circuits are connected, viz. a decoder and memory 27, a comparator 28, a calculator chip 29 and a debounce circuit with signal analysis 30. To the debounce circuit with signal analysis 30 a clock with counting-up register circuit 31 is connected, to which a decoder 32 is connected. A comparator 33 is connected to the calculator chip 29, to the comparator 28 and to the decoder 32, which in its turn is connected to a unit 34 comprising loud-speaker, and light display indicators for indicating the function exchange and key status.

Figure 4:
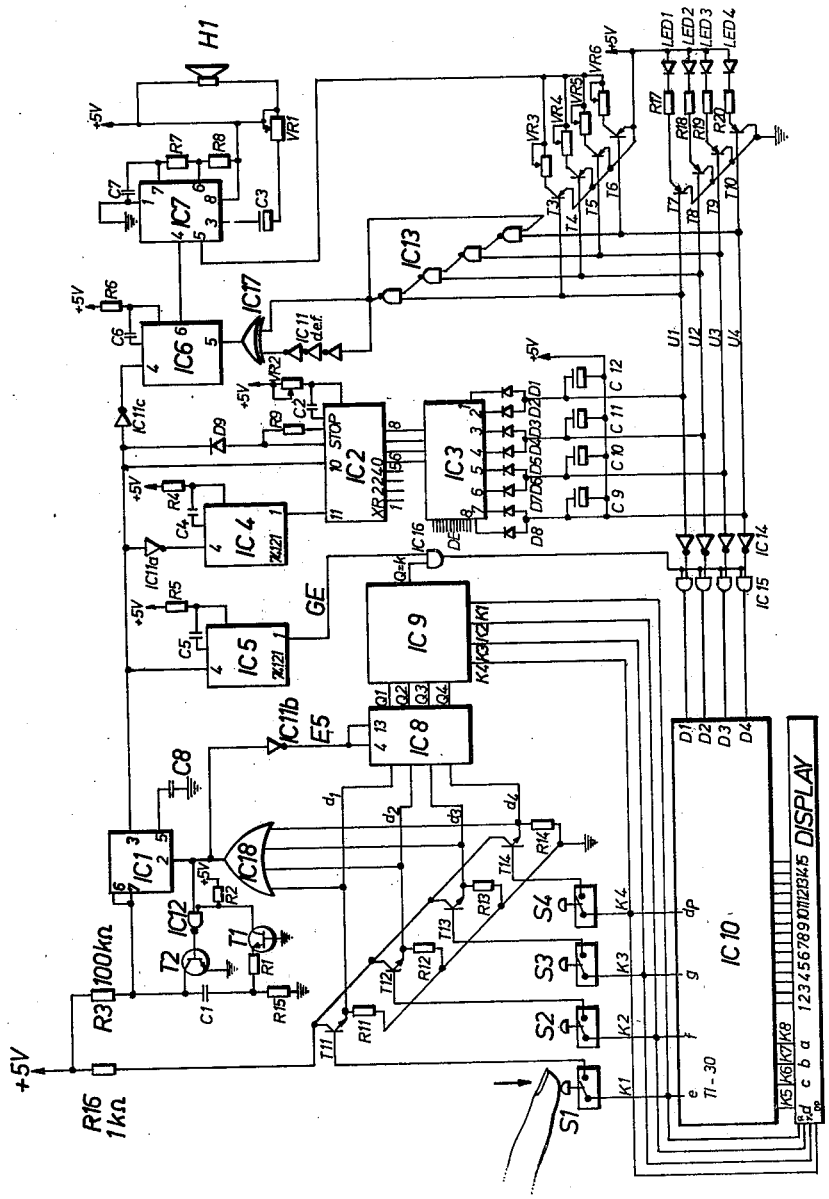
Figure 5:
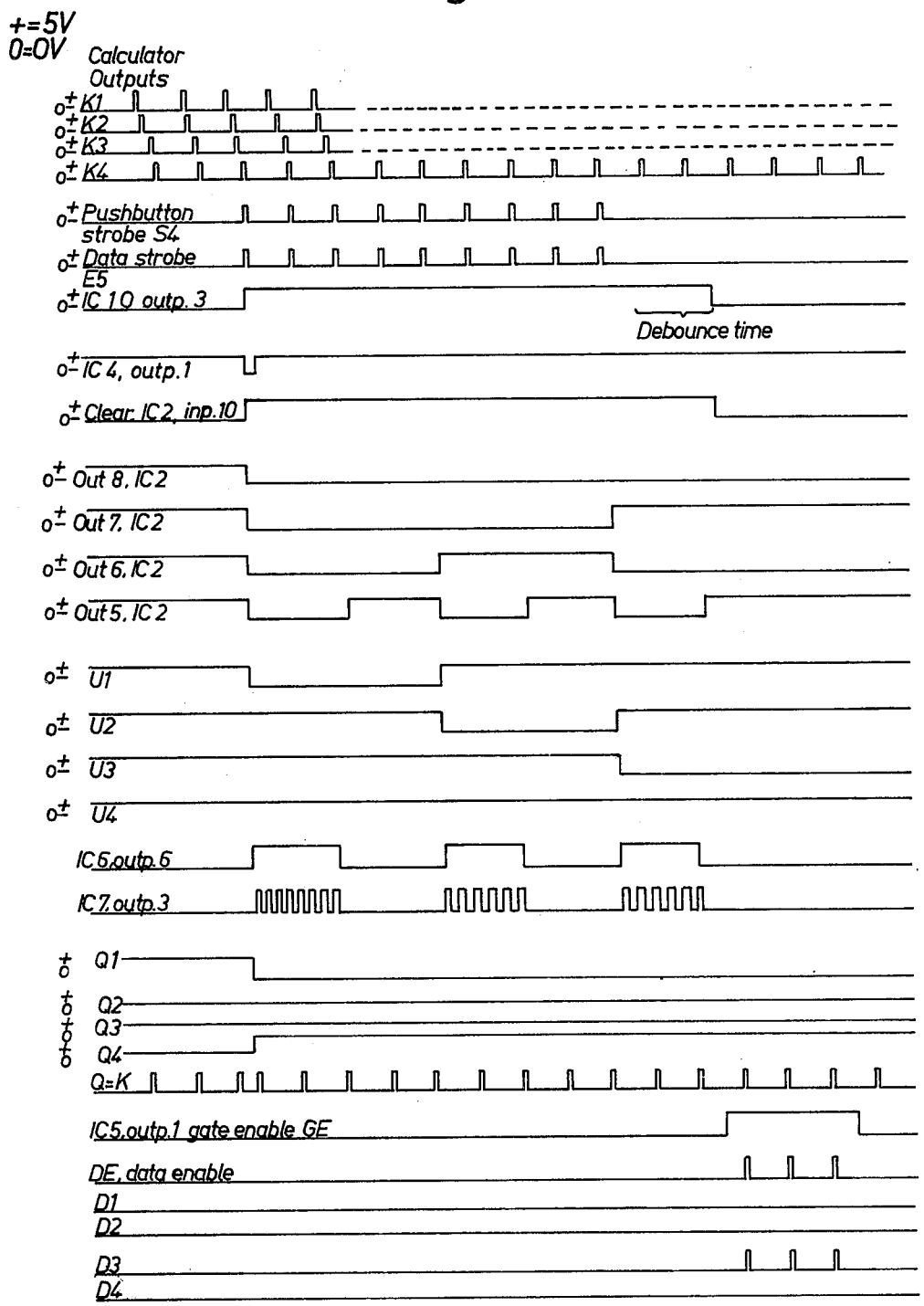

An embodiment chosen by way of example is dealt with in the following, with relation to FIGS. 4 and 5, of which FIG. 4 shows a complete wiring diagram for a calculator with four keys S1-S4, and FIG. 5 shows the timing diagram of certain pulses found in points stated below of a circuit according to FIG. 4, and the time order in which they appear.

When one of the momentary switches S1-S4 is actuated, the corresponding outputs e-dp from a calculator chip IC10 of the type T1-30 contact data lines d1-d4 via a network consisting of transistors T11-T14 of the type 2N3903 and of resistances R11-R14 of 100Ω each. Said data lines d1-d4 are connected to a 4-bit bistable latch circuit IC8 of the type 7475 and to a 4-input OR-element IC18 of the type 7425, the output of which is connected to the input E5 of IC8. Data on any of the lines d1-d4 are thereby decoded and stored in IC8. The output signals from e-dp of the calculator chip IC10 and the stored information from IC8 are compared in a 4-bit magnitude comparator IC9 of the type 7485 with respect to coincidence. When two input signals to IC9 coincide, the output Q=K will be high. This signal is compared with data from a monostable multivibrator IC5 of the type 74121 in a 2-input AND-element IC16 of the type 7408.

As long as a key is held depressed, a strobe pulse is present at the output from IC18, which strobe pulse triggers circuits in a timing circuit IC1 of the type XR555 and actuates transistors T1, T2 of the type BC 109B, resistances R1, R2, R3 and R15 of 100Ω, 10 kΩ, 100 kΩ and 1 kΩ, respectively, a capacitor C1 of 0,1 μF and a NOR-element IC12 of the type 7400. Said circuit comprising IC1 and T1, T2, R1, R2, R3, C1 produces an unbroken high signal of the pulse train when two pulses are not separated relative to each other more than about 10 mS. This high signal appears at the output of IC1, and the positively running edge of this signal triggers a monostable multivibrator IC4 of the type 74121, the output signal of which is applied to a binary timing and calculating circuit IC2 of the type XR2240. This arrangement effects the resetting of IC2 at the beginning of the key-depressing period.

The fact that the output signal at 3 from IC1 shifts logic level when the key is not depressed, stops the clock at IC2 because this logic level is low (all keys are unactuated).

The clock frequency is determined by a capacitor C2 of, for example, 0,15 μF and by a variable resistance VR2 of 0–5 kΩ, and in this case is between 500 and 32 Hz, which thereby provides a duration of 1/16 to 1 second at the output 6 of IC2. When the outputs 1-8 from IC2 are counted up, register outputs 1-16 of a decoder/demultiplexer IC3 are low one at a time and thereby cause one of the output signals U1-U4 to be low for 1/16 to 1 second.

The output 3 from IC1 is also connected via an inverter IC11c of the type 7404 to a monostable multivibrator IC6 of the type 74121. The output signal from this output 3 on IC1 triggers IC6 when the output shifts logic level, because the key is depressed. The output signal from the output 6 on IC6 actuates then an input 4 to a timing circuit IC7 of the type 555 and a sound circuit consisting of a resistance R7 of 1100Ω, a resistance R8 of 47 kΩ, a capacitor C7 of 10 μF, and a loud-speaker H1 during a pulse duration preset to about 50 mS by a variable resistance R6 of 0–5 kΩ and a capacitor C6 of 10 µF. Said sound circuits with IC7 as the active component feed a square-wave signal to the output 3 of IC7, which output is connected via the capacitor C3 and the variable resistance VR1 to the loudspeaker H1. Said square-wave signal operates at a frequency of about 1000 Hz.

Pairs of resistances VR3-VR6 of 0-5 kΩ and of PNP-transistors T3-T16 of the type 2N3905 one at a time set different logic levels on the input 5 of IC7, thereby causing shifting in the square-wave frequency from, for example, 800 Hz to 1200 Hz, 1200 Hz to 1000 Hz or 1000 Hz to 1600 Hz from loudspeaker H1 in order to create sound signals corresponding to each circuit connection prepared.

Capacitors C9-C12 of 10 µF prevent spikes to appear on the lines U1-U4.

When the low signal shifts from one output UN to UN+1, a circuit 13 comprising four NOR-elements detects this shifting and provides a different logic level for each shifting. Inverters IC11d, e, f of the type 7404 and an exclusive-or element IC17 of the type 7404 produce short pulses each time the logic level of IC13 shifts. These pulses trigger IC6, which in its turn causes the loud-speaker H1 to sound.

The output lines U1-U4 are also connected to bases of PNP-transistors T7-T10 of the type 2N 3905, and the voltage on that of U1 to U4 which is low causes the corresponding transistor to ignite a connected light-emitting diode LED1-4 of the type MV5254, MV5354 or MV5754. The logic state of the outputs U1-U4 then is shown on said LED1-4.

Upon releasing the key, the negatively running edge of the output 3 from IC1 triggers the monostable multivibrator IC5, the output 1 of which becomes high for a short period, which is preset to about 30 m S by a capacitor C5 of 47 µF and a resistance R5 of 860Ω.

This actuates the strobe signal at the AND-element IC 16 of the type 7408, which strobe signal then appears at an AND-element IC15 of the type 7408. As only one of the output signals U1-U4 is low after the inverter IC14 of the type 7406, only one line is high. This line permits the strobe signal to pass through the AND-element IC15, which signal then is received by the calculator chip IC10 of the type Texas Instruments TI-30 and accepted by IC10 as a signal corresponding to a signal, which normally comes via a key directly from the outputs e-dp from IC10.

When the key has been released, the output 3 from IC1 is on low logic level and causes via a diode D9 of the type IN914 the clock at IC2 to stop. Therefore, no strobe shifting appears between the D-inputs of IC10.

The appearances and time sequences of the pulses are illustrated in FIG. 5, from, as an example, S4 is being depressed until it has been released.

Figure 6:
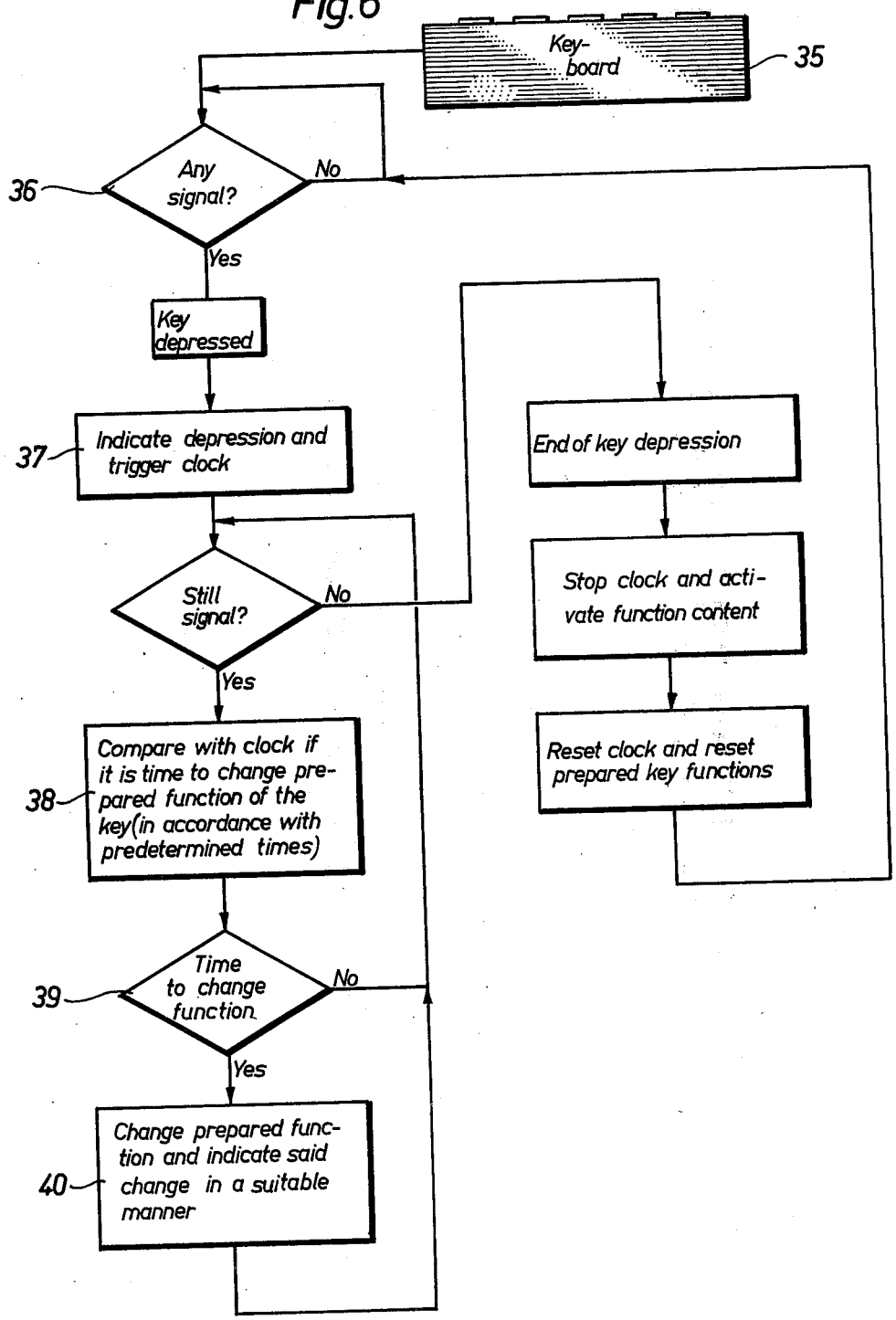

In FIG. 6 is illustrated by a block diagram how the process proper can be regarded to take place. To the keyboard of a calculator 35 a signal collector 36 is connected, after which possible interferences are sensed. When the signal from a key has gone on for a longer period, for example exceeding 0,005 second, in order to eliminate a possible contact bounce or interference, the circuit recognizes that a key is depressed and at the same time a clock at 37 is started. Some time thereafter again is sensed if a signal still exists, and simultaneously the time elapsed is compared at 38 and 39 with the clock in order to find out, if it is the right time for exchanging the function of the key. If so is the case, function exchange is carried out and indicated at 40 by means of, for example, optic and/or acoustic signals. At the absence of a signal from the key, it is stated that the key is not depressed any longer, the clock is stopped, and the function content is effected, for example by the digit one shown on a screen (not shown).

Figure 7:
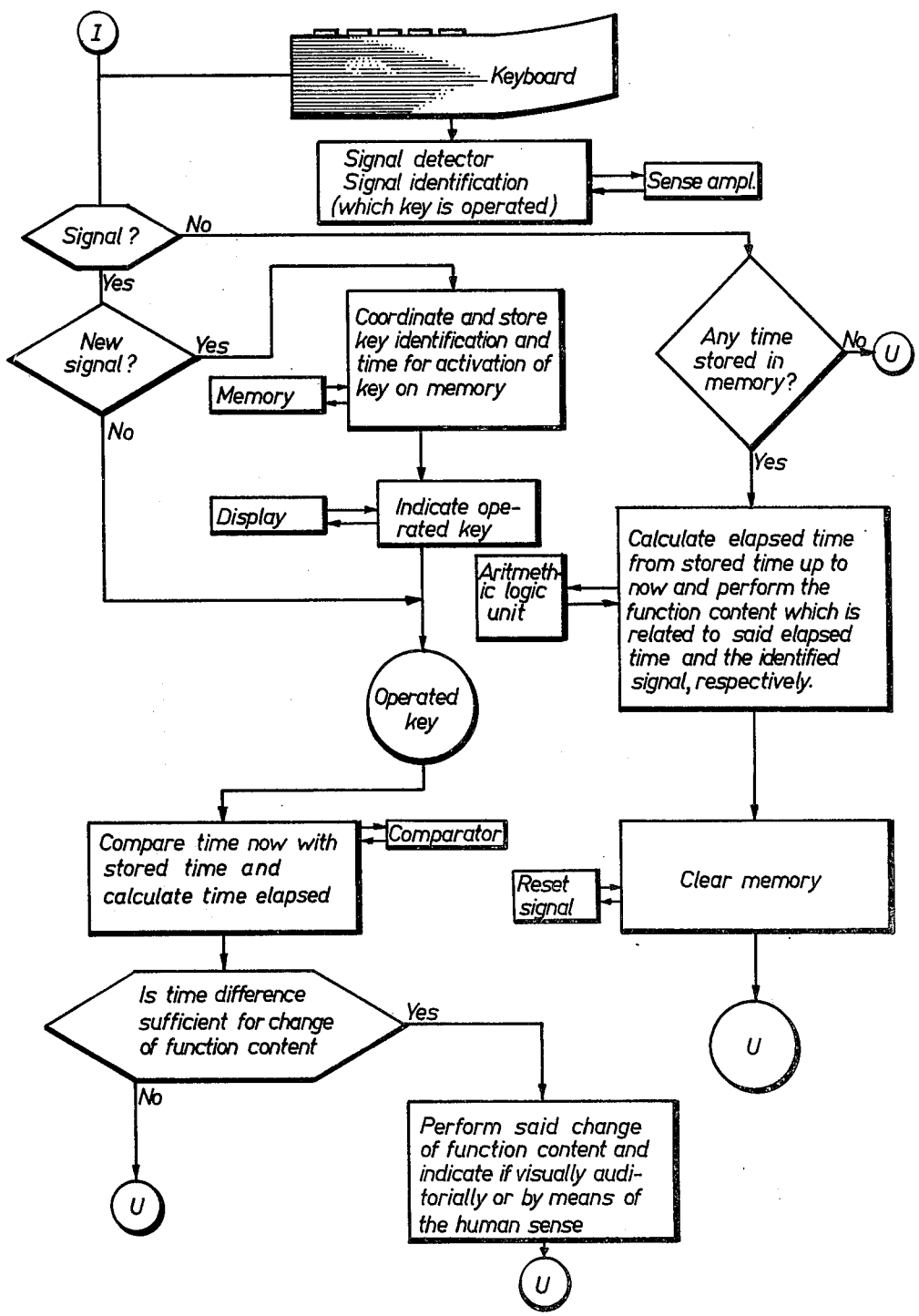

FIG. 7 illustrates in a somewhat different and clearer way substantially the same as FIG. 6, and the text indicated in FIG. 7 shows clearly and distinctly the procedure, so that a further explanation thereof does not seem necessary.

Figure 8:
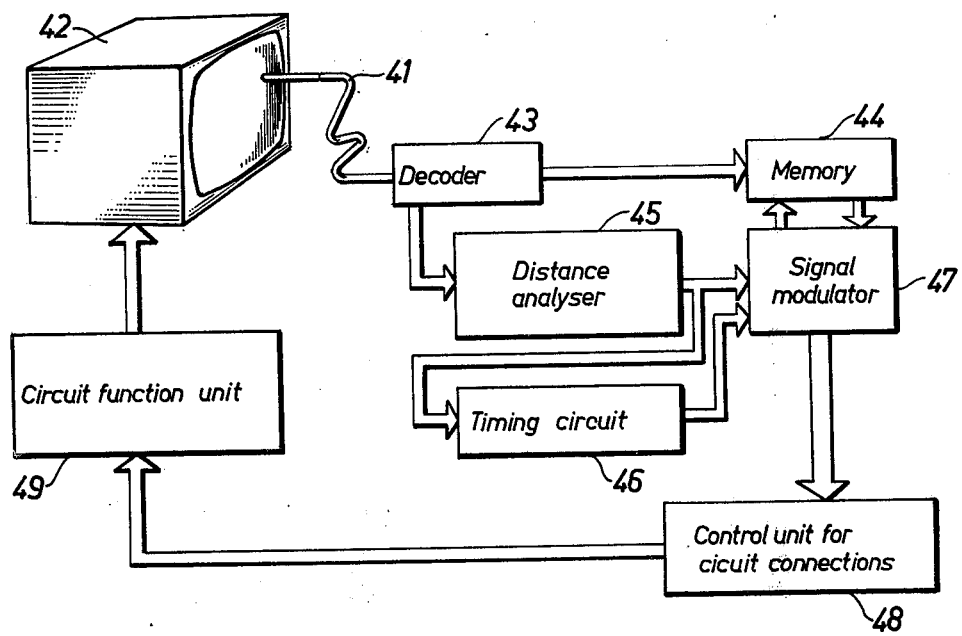
FIG. 8 shows the principle of the invention applied to a light pen.

An interesting application of the invention is shown in FIG. 8. Instead of a key a light pen 41 or similar means is used which is connected to a screen 42 in such a way that upon approaching the pen 41 to the screen an indefinite time course is started which thereafter is determined as to duration by removing the pen from the screen. The duration determines what is to be displayed on the screen. As an example of possibilities can be mentioned that a circuit designer by means of the light pen and screen can draft a complete electric wiring diagram in the manner as follows. The light pen 41 is moved close to the screen 42 and retained there for a certain period which, for example, corresponds to the time required for drafting a capacitor. The pen then is removed, and after a certain time a capacitor automatically is drafted on the screen 42. By choosing said certain time longer or shorter, a resistance and a transistor, respectively, can instead be drafted.

The basic circuits required for carrying out the aforesaid are a decoder 43, a memory 44, distance analyzing circuits 45, timing circuits 46, a signal modulation unit 47, a control unit 48 for circuit connections and a circuit function unit 49.

Instead of an electric wiring diagram, for example, the course for a whole manufacturing process can have been fed into a memory, and by means of the time selected parts of the course can be displayed on the screen 42 thereby that the duration of time for the contact of the light pen with the screen is related to the information desired to be displayed on the screen.

Figure 9:
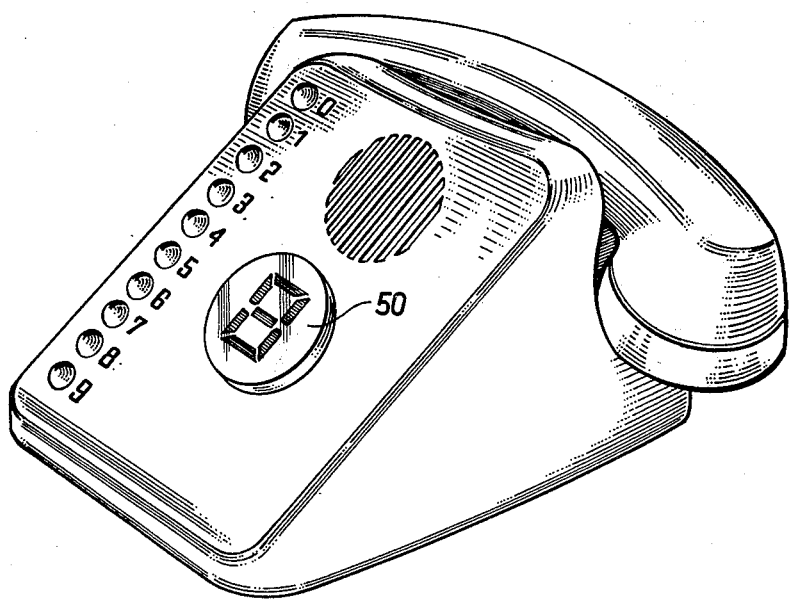
FIG. 9 shows the invention applied to a telephone set.

In FIG. 9 the present invention is shown applied to a telephone set.

A normal dial or button set for signalling has been replaced according to the invention by a single key 50 and ten lamps marked 0,1, 2 a.s.o. up to 9.

The signalling takes place as follows. Let it be assumed that the telephone number 32 19 68 is to be selected. The key 50 is depressed, the lamp for the digit zero lights up, after about 0,2 second the lamp for the digit one is lighted and the lamp for the digit zero is extinguished, after further 0,2 second the lamp for the digit three is lighted and the lamp for the digit two is extinguished. Thereafter the key 50 is released. Every function content, i.e. every exchange of digit is indicated by the associated lamp, but can also be indicated by sound and possibly also by means of wires caused to vibrate at different frequencies and different combinations of frequencies, respectively, in response to the digit to be indicated. The digit three thus prepared is then signalled in the usual way.

Thereafter the subsequent digit two is prepared and signalled in a corresponding way. There are two different ways to select digits for the entire operation. (1), at the second depression of the key 50 the sequence can continue, so that the lamp for the next digit four, will light. (2) The sequence restarts at or for the digit zero, so that the 0 lamp will light. Regardless of the method chosen, the key 50 is held depressed until the correct lamp is lighted, i.e. in this case the lamp for digit two, whereafter the key 50 is released. Optical, acoustical and/or sensing indication is carried out simultaneously, and the signalling of the digit two then is carried out in the usual way.

The process is repeated until the complete number has been dialled.

The present invention can be applied in many different fields, for example for selecting different programs in wireless and television, channel changes control of lathes automatic machine tools, and the like.

The invention further can be utilized in measuring instruments, for example a universal measuring instrument with one key, where depression, for example, for a certain time enables circuits connecting the instrument as a voltmeter, for a longer time as an ohmmeter and for a still longer time as an amperemeter, etc.

What is claimed is:

1. Method of effecting one of several predetermined mutual different circuit connections comprising the steps of
    initiating a course of sequentially occurring time windows, or time frames, or time intervals, or time slots in a predetermined sequence, starting from an initial first time slot, including
    actuating a switch to start said sequence and maintaining actuation of said switch for at least a certain time corresponding to the first time slot in said initiated sequence, a first preset circuit connection being associated with said first time slot and being prepared upon actuation of the switch;
    temporally associating respective further circuit connections with respective time slots including
    preparing respective circuit connections associated with the respective time slots as sequential time slots occur, circuit connections associated with preceding time slots being disconnected and new circuit connections established whereby, when actuation of a switch persists for a longer period than the interval of said time slot, the circuit connections will shift at a predetermined point of time corresponding to the transition between said first time slot and the sequentially occurred time slot, and subsequently, to the transition between subsequent time slots;
    controlling the length of the time course by selecting a predetermined number of the sequential time slots to effect the circuit connection associated with the respective selected one of the time slots;
    and indicating each point of time corresponding to a time slot to provide an operator with a preceptible output of the then existing time slot of the course during each instant of time.

2. Method according to claim 1 further including the step of continuing to indicate the representation of the selected circuit associated with the selected time slot after reverse actuation of the switch for a certain checking time to permit an operator to check his selection, the circuit connection becoming effective upon elapse of said checking time.

3. Method according to claim 2, to establish a telephone number dial connection including the step of emitting a signal corresponding to the selected circuit when said circuit connection has become effective upon elapse of said checking time.

4. Method according to claim 2 including the step of repeating operation of said switch before elapse of said checking time to establish a cancelling circuit and cancel said selection established during the respective time slot.

5. Method according to claim 2, including the step of repeating operation of said switch before elapse of said checking time to establish a cancelling circuit and cancel said selection established during the respective time slot upon initiation of said further switching operation before elapse of said checking time to cancel said selection and hence inhibit said circuit connection.

6. Method according to claim 1 wherein the step of indicating the point of time corresponding to a time slot comprises providing an output including at least one of: optical perceptive output; acoustically perceptive output; touch-perceptive output.

7. Method according to claim 6 wherein said output includes rythmic variations.

8. Method according to claim 1 wherein the length, time intervals, of said time slots is nonuniform, the first one of said time slots, time windows, or time frames being longer than subsequent time slots.

9. Method according to claim 1 wherein said different circuit connections include calculator circuits connected to an electronic data processing unit;
    and wherein said circuit connection includes first and second functional circuits of functionally different significance;
    a plurality of control buttons are provided, each associated with different circuit connections, and wherein the operations of functionally similar significance are associated with similarly occurring time slots upon operation of any one of said plurality of control buttons.

10. Method according to claim 1, to enter data in a screen display device, wherein the switch comprises a pointer, switch actuation being initiated when said pointer is located with respect to the screen by a predetermined distance;
    and wherein the time of position of said pointer at said predetermined distance with respect to the screen determines the number of time slots, or time windows, and hence a sequential specific display of the specific symbols,
    and further including the step of retaining the indication of the last circuit established, and the display corresponding to said last circuit at the location where the pointer was located upon removal of the pointer from said location with respect to the screen.

11. Method according to claim 10, further including the step of resuming the generation of courses of time slots from the last time slot of a course upon again moving said pointer to the previous location on the screen at said distance after having removed the pointer therefrom, to continue the course, and establish subsequent circuit connections and hence display of symbols representative thereof at said locations.

12. Method according to claim 10, further including the step of manually initiating a further switching operation to fix the circuit connection last indicated on the screen regardless of subsequent approach of the pointer to the screen at said location.

13. Method according to claim 12, further including the step of continuing the representation of the selected circuit on the screen at said selected location regardless of subsequent movement of the pointer in the vicinity of said selected location.

14. Method according to claim 10 including the step of indicating a representation of the circuit selected upon initiation of the switching operation comprising displaying said indication on the screen at the location at which said pointer and said screen are in juxtaposition.

15. Method according to claim 1 further comprises the step of generating an interlock disabling circuit connection upon starting said course to produce a signal which prevents circuit connections which are, in the time slot sequence, associated with time slots outside of the then existing time slot window time interval or time frame.

16. Method according to claim 1 further comprising the step of indicating a representation of the circuits selected upon initiation of the further switching operation.

17. Method according to claim 16 wherein the step of initiating the further switching operation, comprises deactuating the previously operating switch.

18. Method according to claim 16 wherein the step of initiating a further switching operation comprises operating a separate switch (FIG. 3-CE).

19. System to selectively control connection of one of several circuit connections
in which said several connections are sequentially selectable in a predetermined sequence, comprising
a clock source (IC2), providing temporally sequential clock signals, each signal being representative of a time window, or time frame, or time slot;
a control switch (S1, S2, S3, S4, 41, 50);
selection circuit means (IC3, IC15) interconnecting said control switch, the clock source (IC2) and said several circuit connections (IC10, 48) and preparing, sequentially in said predetermined sequence starting from a preset connection, one each of said several circuit connections as the clock source provides temporally sequential clock signals during continued operation of said one control switch;
means effecting the one selected circuit connection of said prepared circuit connection;
indicator means (LED 1-4; H1) indicating the specific sequential clock signal which is applied to said circuit selection means at any instant of time to thereby indicate the respective time slot during which said one control switch is operating and;
delay means interconnecting the selection circuit means and the switch means and controlling the circuit effecting means to establish, after a predetermined time delay, the selected circuit if said one control switch is operated to terminate continued operation thereof and hence continued supply of clock signals from said clock source.

20. System according to claim 19, further including time delay means effecting the prepared circuit connection after a predetermined time delay after the termination of the length of the time course.

21. System according to claim 19 further including timing means disabling connection of the prepared circuit connection after termination of the length of the time course formed by the plurality of temporally sequential signals.

* * * * *